United States Patent
Li et al.

(10) Patent No.: US 7,462,868 B2
(45) Date of Patent: Dec. 9, 2008

(54) LIGHT EMITTING DIODE CHIP WITH DOUBLE CLOSE-LOOP ELECTRODE DESIGN

(75) Inventors: Yun-Li Li, Tao-Yung Hsien (TW); Hui-Ching Feng, Tao-Yung Hsien (TW)

(73) Assignee: Formosa Epitaxy Incorporation, Tao-Yung Hsien (TW)

(*) Notice: Subject to any disclaimer, the term of this patent is extended or adjusted under 35 U.S.C. 154(b) by 22 days.

(21) Appl. No.: 11/307,877

(22) Filed: Feb. 26, 2006

(65) Prior Publication Data

US 2007/0200120 A1    Aug. 30, 2007

(51) Int. Cl.
*H01L 27/15* (2006.01)

(52) U.S. Cl. .............. 257/79; 257/91; 257/99

(58) Field of Classification Search .......... 257/91, 257/99, 79, 81, 94, 95, 98; 438/29, 32, 39, 438/42, 46, 47
See application file for complete search history.

(56) References Cited

U.S. PATENT DOCUMENTS

| | | | | |
|---|---|---|---|---|
| 5,861,636 A | * | 1/1999 | Dutta et al. | 257/91 |
| 6,307,218 B1 | | 10/2001 | Steigerwald et al. | 257/99 |
| 6,344,665 B1 | * | 2/2002 | Sung et al. | 257/91 |
| 6,445,007 B1 | * | 9/2002 | Wu et al. | 257/91 |
| 6,518,598 B1 | | 2/2003 | Chen | 257/91 |
| 2006/0001035 A1 | * | 1/2006 | Suehiro et al. | 257/91 |

* cited by examiner

*Primary Examiner*—Kevin M Picardat
(74) *Attorney, Agent, or Firm*—Jianq Chyun IP Office

(57) ABSTRACT

An LED chip with double close-loop electrode design includes a substrate, a first-type doped semiconductor layer, a light emitting layer, a second-type doped semiconductor layer, a first electrode and a second electrode. The first-type doped semiconductor layer is disposed on the substrate, the light emitting layer is disposed on the first-type doped semiconductor layer and the second-type doped semiconductor layer is disposed on the light emitting layer. The first electrode, disposed on the first-type doped semiconductor layer, has a close-loop pattern. The second electrode, disposed on the second-type doped semiconductor layer, is located inside a region encircled by the first electrode and has a close-loop pattern. In this way, the LED chip with double close-loop electrode design is able to avoid deteriorated luminous efficiency caused by broken electrodes.

12 Claims, 8 Drawing Sheets

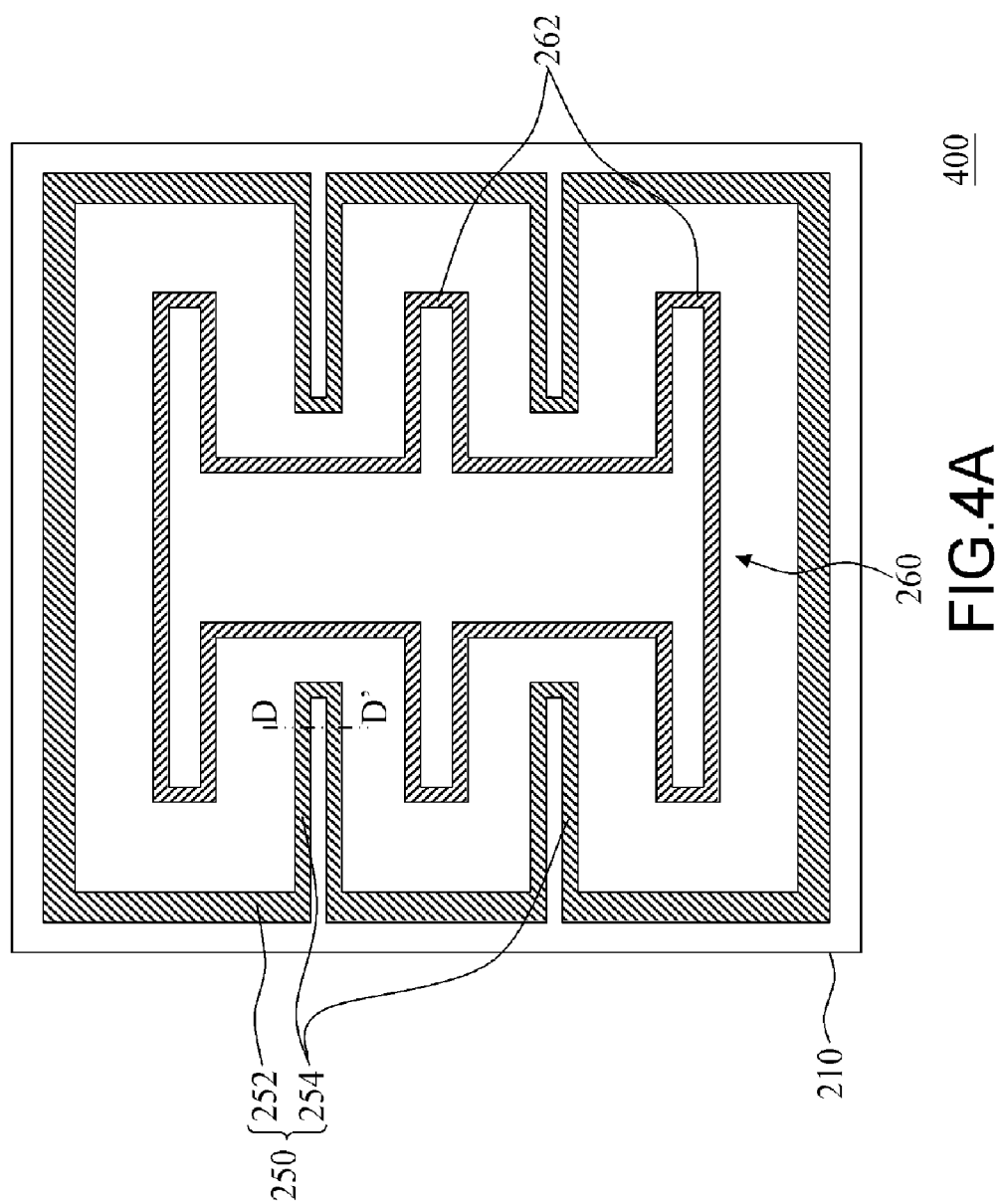

LIGHT EMITTING DIODE CHIP WITH DOUBLE CLOSE-LOOP ELECTRODE DESIGN

BACKGROUND OF THE INVENTION

1. Field of Invention

The present invention relates to a semiconductor device, and particularly to a light emitting diode chip (LED chip).

2. Description of the Related Art

A light emitting diode (LED) is a semiconductor device, and the material of the emitting chip is usually chemical elements of group III, group IV and group V, namely compound semiconductors, such as gallium phosphide (GaP), gallium arsenide (GaAs) and gallium nitride (GaN). Applying current to the compound semiconductors by means of recombination of electrons and holes, the electric energy is converted into optic energy and released in photon form to achieve light radiation. The light radiation of an LED is belonged to the so-called "cool light radiation", rather than radiated by heat, therefore, the lifetime of an LED can be over a hundred thousand hours without any idling time. In addition, an LED has advantages such as fast response speed (about 10-9 second), small volume, electricity saving, low pollution (mercury free), high-reliability and adaptable to mass production. Hence, LEDs are widely used in many fields, such as light sources of scanners, backlight sources of LED screens, outdoor display boards or vehicle lightings.

FIG. 1A is a schematic top view of a conventional LED chip and FIG. 1B is a schematic cross-sectional drawing taken along section plane A-A' in FIG. 1A. Referring to FIGS. 1A and 1B, a conventional LED chip 100 includes a substrate 110, an N-type doped semiconductor layer 120, a light emitting layer 130, a P-type doped semiconductor layer 140, an N-type electrode 150 and a P-type electrode 160. The N-type doped semiconductor layer 120 is disposed on the substrate 110, the light emitting layer 130 is disposed on the N-type doped semiconductor layer 120 and the P-type doped semiconductor layer 140 is disposed on the light emitting layer 130. The N-type electrode 150 disposed on the N-type doped semiconductor layer 120 comprises a first bar-like pattern 152 and a plurality of first branches 154, while the P-type electrode 160 disposed on the P-type doped semiconductor layer 140 comprises a second bar-like pattern 162 and a plurality of second branches 164.

In addition, the first bar-like pattern 152 is opposite to the second bar-like pattern 162; the first branches 154 are connected to the first bar-like pattern 152 and located at a side of the first bar-like pattern 152. The second branches 164 are connected to the second bar-like pattern 162 and located at a side of the second bar-like pattern 162. The first branches 154 and the second branches 164 are alternately arranged to each other.

When the N-type electrode 150 and the P-type electrode 160 apply a forward current to the LED chip 100, the electrons and the holes are transmitted to the light emitting layer 130 from the N-type doped semiconductor layer 120 and the P-type doped semiconductor layer 140, respectively, and are recombined there so as to release energy in photon form and radiate light.

Note that the N-type electrode 150 and the P-type electrode 160 herein take open-loop form, therefore if the N-type electrode 150 or the P-type electrode 160 was broken accidentally (as shown at area 50 in the figure), a part of the LED chip 100 would be an electric open-circuit. Consequently, a partial region of the light emitting layer 130 would not radiate light, which reduces the luminous efficiency of the LED chip 100.

In particular, the larger the size of the LED chip 100, the more serious the negative effect on the luminous efficiency from the broken N-type electrode 150 or P-type electrode 160 is. Furthermore, for a larger-sized LED 100 in the prior art, a total internal reflection (TIR) of the light emitted from the light emitting layer 130 inside the LED 100 is more remarkable, which would further deteriorate the luminous efficiency of the LED chip 100.

SUMMARY OF THE INVENTION

Based on the above described, an object of the present invention is to provide an electrode design for an LED chip, suitable for avoiding deteriorated luminous efficiency caused by broken electrodes.

To achieve the above-described or other objects, the present invention provides an LED chip with double close-loop electrode design, which includes a substrate, a first-type doped semiconductor layer, a light emitting layer, a second-type doped semiconductor layer, a first electrode and a second electrode. The first-type doped semiconductor layer is disposed on the substrate; the light emitting layer is disposed on the first-type doped semiconductor layer and exposes a part of the first-type doped semiconductor layer, while the second-type doped semiconductor layer is disposed on the light emitting layer. The first electrode is disposed on the first-type doped semiconductor layer and has a close-loop pattern. The second electrode, disposed on the second-type doped semiconductor layer, resides inside a region encircled by the first electrode and has a close-loop pattern.

In an embodiment of the present invention, the above-described first electrode has a profile of rectangle, circle, ellipse or polygon.

In an embodiment of the present invention, the above-described second electrode has a profile of rectangle, circle, ellipse or polygon.

In an embodiment of the present invention, the above-described first electrode includes a close-loop pattern and a plurality of first branches. The close-loop pattern encircles a close region on the first-type doped semiconductor layer, while the first branches connect the close-loop pattern and reside inside the close region.

In an embodiment of the present invention, the regions inside the profiles of the above-described first branches are hollow regions.

In an embodiment of the present invention, the above-described second electrode has a plurality of second branches, and the above-described plurality of the first branches and the above-described plurality of the second branches are alternately arranged to each other.

In an embodiment of the present invention, the region encircled by the above-described second electrode is a hollow region, which goes through the second-type doped semiconductor layer and the light emitting layer for exposing a part of the first-type doped semiconductor layer.

In an embodiment of the present invention, the above-described first-type doped semiconductor layer and second-type doped semiconductor layer can have a plurality of micro-structures residing on the exposed surfaces of the first-type doped semiconductor layer and the second-type doped semiconductor layer.

In an embodiment of the present invention, the above-described micro-structures have a periodic regular arrangement or a stochastic irregular arrangement.

In an embodiment of the present invention, the above-described first-type doped semiconductor layer includes a buffer layer, a first-type contact layer and a first-type cladding layer. The buffer layer is disposed on the substrate, the first-type contact layer is disposed on the buffer layer, and the first-type cladding layer is disposed on the first-type contact layer and exposes a part of the first-type contact layer so as to make the first electrode disposed on the first-type contact layer.

In an embodiment of the present invention, the above-described second-type doped semiconductor layer includes a second-type cladding layer and a second-type contact layer. The second-type cladding layer is disposed on the light emitting layer, the second-type contact layer is disposed on the second-type cladding layer and the second electrode is disposed on the second-type contact layer.

In an embodiment of the present invention, the above-described first-type doped semiconductor layer is an N-type doped semiconductor layer, while the second-type doped semiconductor layer is a P-type doped semiconductor layer.

In summary, in the LED chip with double close-loop electrode design of the present invention, since both the first electrode and the second electrode have close-loop patterns, if the first electrode or the second electrode is broken, the electrodes at both ends of the broken area still remain electric conductivity without affecting the luminous efficiency of the LED chip. Besides, since the hollow region inside the profile of the second electrode in the present invention goes through the second-type doped semiconductor layer and the light emitting layer for exposing the first-type doped semiconductor layer, the light radiation can be improved and the luminous efficiency can be upgraded.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

FIG. 4A is a schematic top view of an LED chip with double closed-loop electrode design according to the third embodiment of the present invention.

DESCRIPTION OF THE EMBODIMENTS

The First Embodiment

Figure 1A:
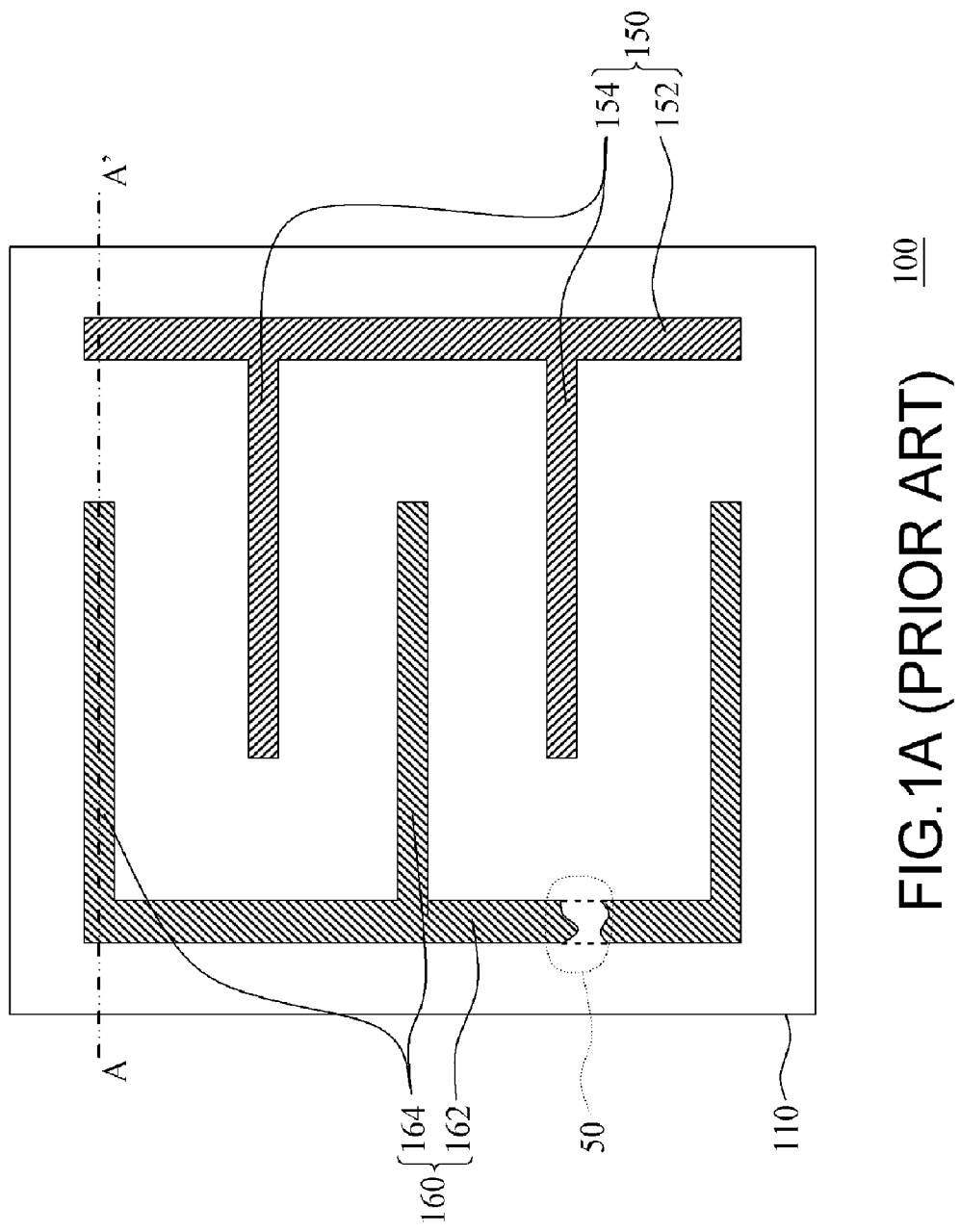
FIG. 1A is a diagram of a conventional LED chip.
Figure 1B:
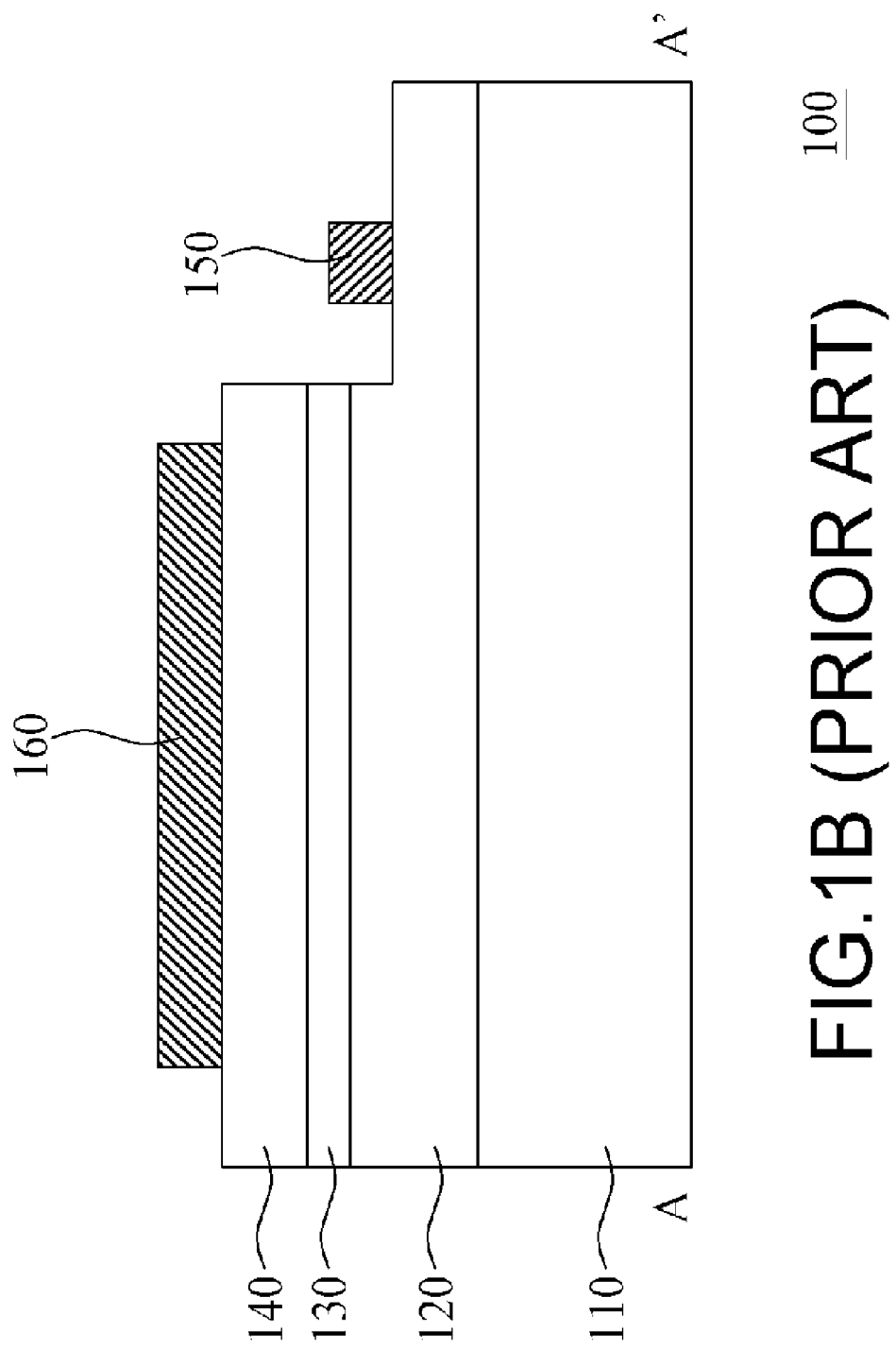
FIG. 1B is a schematic cross-sectional drawing taken along section plane A-A' in FIG. 1A.
Figure 2A:
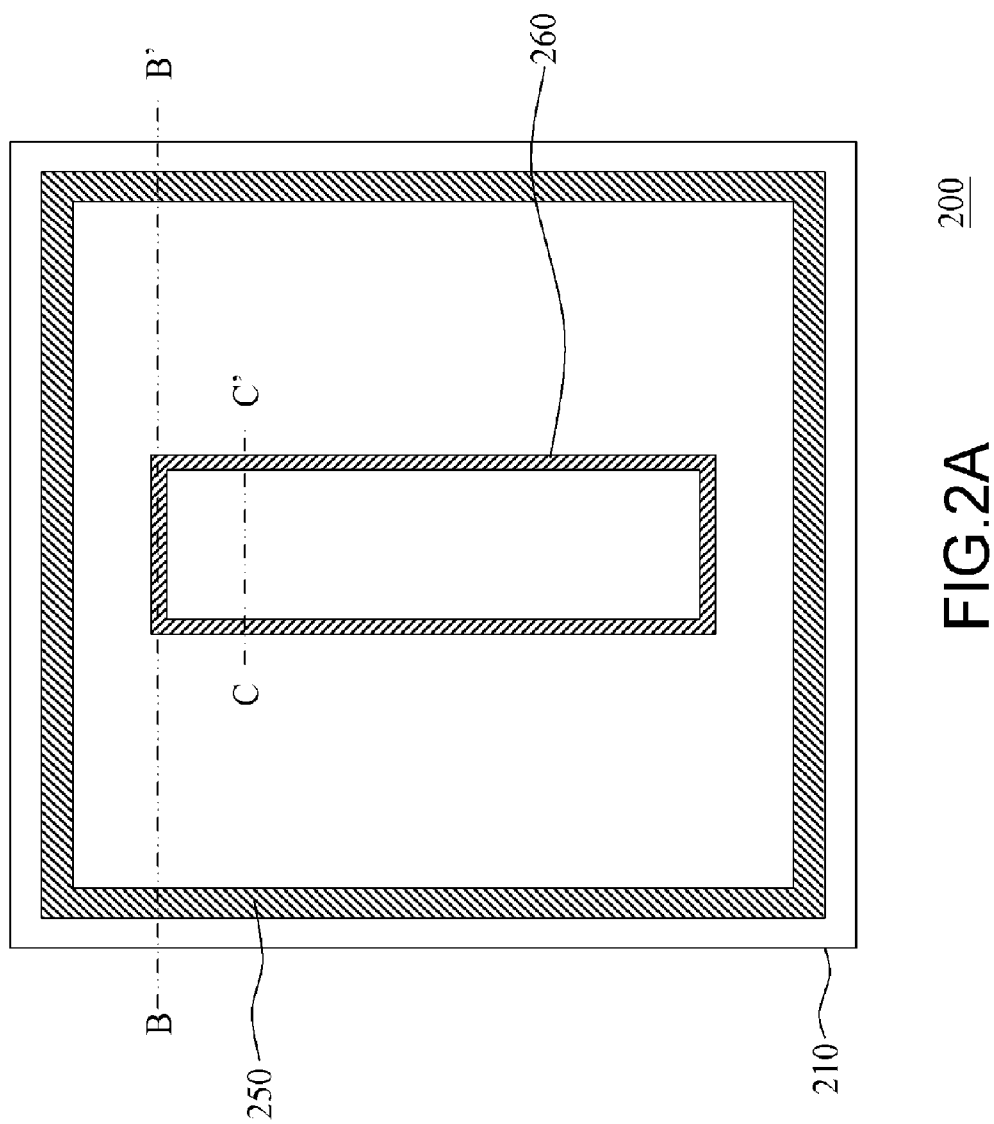
FIG. 2A is a schematic top view of an LED chip with double closed-loop electrode design according to the first embodiment of the present invention.
Figure 2B:
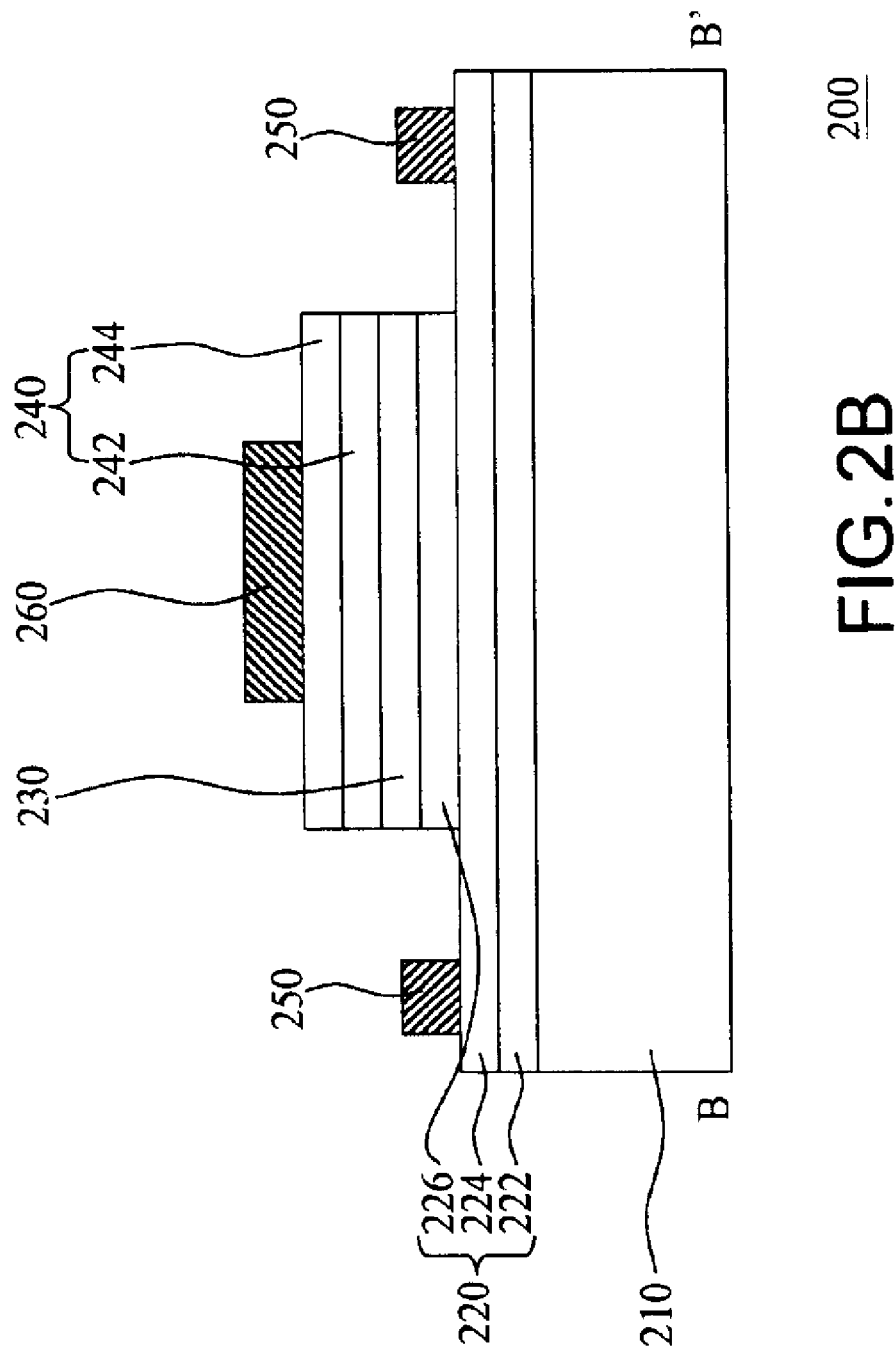
FIG. 2B is a schematic cross-sectional drawing taken along section plane B-B' in FIG. 2A.

FIG. 2A is a diagram of an LED chip with double closed-loop electrode design according to the first embodiment of the present invention and FIG. 2B is a schematic cross-sectional drawing taken along section plane B-B' in FIG. 2A. Referring to FIGS. 2A and 2B, an LED chip 200 with double close-loop electrode design of the present invention includes a substrate 210, a first-type doped semiconductor layer 220, a light emitting layer 230, a second-type doped semiconductor layer 240, a first electrode 250 and a second electrode 260. The first-type doped semiconductor layer 220 is disposed on the substrate 210; the light emitting layer 230 is disposed on the first-type doped semiconductor layer 220 and exposes a part of the first-type doped semiconductor layer 220, while the second-type doped semiconductor layer 240 is disposed on the light emitting layer 230. The first electrode 250 is disposed on the first-type doped semiconductor layer 220 and has a close-loop pattern. The second electrode 260, disposed on the second-type doped semiconductor layer 240, resides inside a region encircled by the first electrode 250 and has a close-loop pattern.

When the first electrode 250 and the second electrode 260 apply a forward current to the LED chip 200 with double close-loop electrode design, the electrons and the holes would via the first-type doped semiconductor layer 220 and the second-type doped semiconductor layer 240 be transmitted into the light emitting layer 230 for recombination, and then an energy in photon form is released so as to achieve light emitting result. Wherein, since the first electrode 250 and the second electrode 260 have close-loop patterns, therefore, if the first electrode 250 or the second electrode 260 is broken, the electrodes at both ends of the broken area still remain electric conductivity without affecting the luminous efficiency of the LED chip 200 with double close-loop electrode design.

In the embodiment, the profiles of the first electrode 250 and the second electrode 260 are, but not limited to, rectangles. The profile shape thereof can also be, for example, circle, ellipse, polygon, irregular shape or other appropriate shapes. For those skilled in the art, an appropriate shape for the profiles of the first electrode 250 and the second electrode 260 can be deduced by themselves without difficulty. For simplicity, the shapes are not illustrated herein.

Figure 2C:
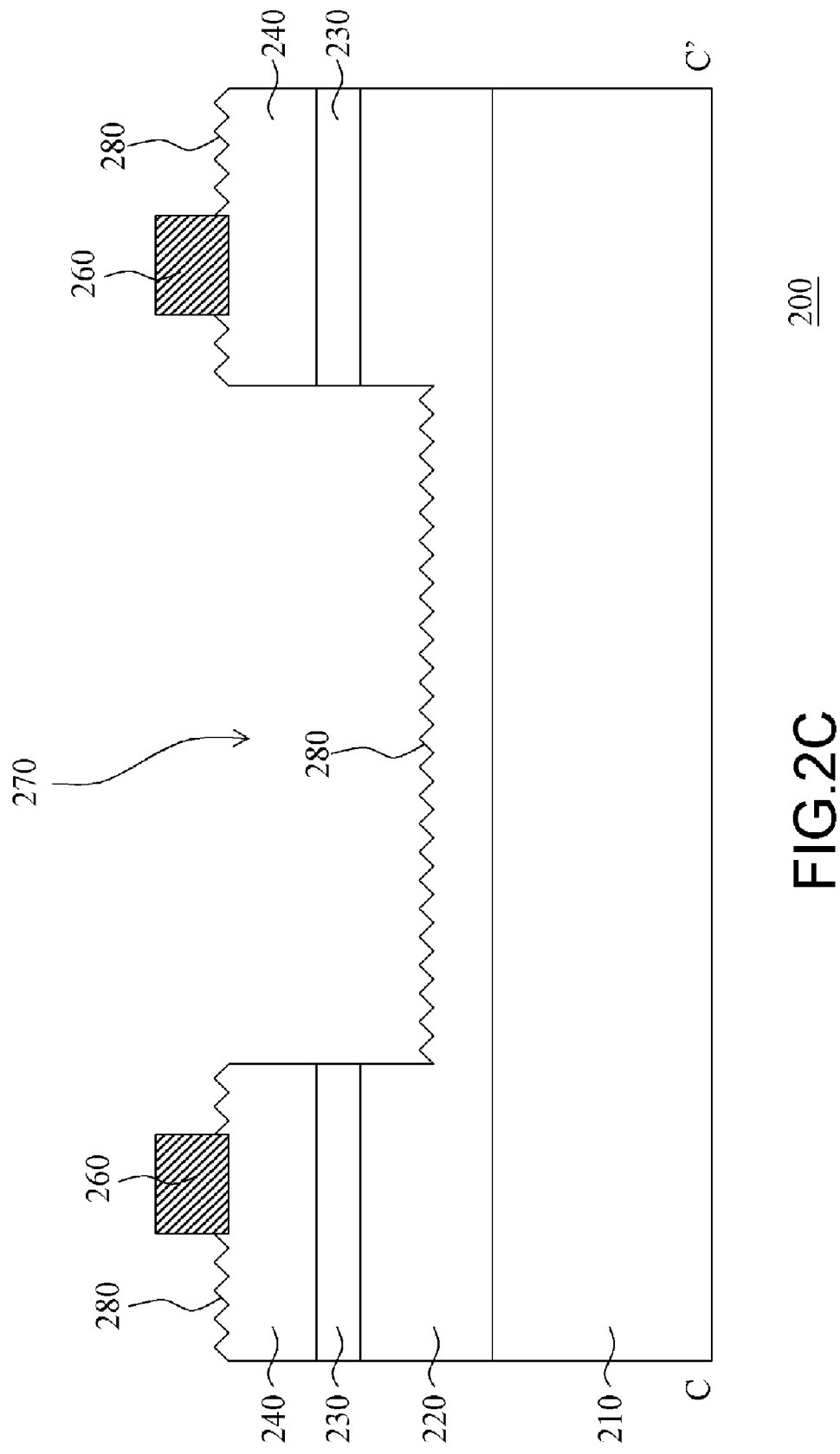
FIG. 2C is a schematic cross-sectional drawing taken along section plane C-C' in FIG. 2A.

Note that according to the present invention the partial region encircled by the second electrode 260 can be a hollow region for advancing the luminous efficiency of the LED chip 200 with double close-loop electrode design. Referring to FIG. 2C, it is a schematic cross-sectional drawing taken along section plane C-C' in FIG. 2A. The partial region encircled by the second electrode 260 can be a hollow region 270, which goes through the second-type doped semiconductor layer 240 and the light emitting layer 230 for exposing a part of the first-type doped semiconductor layer 220. In this way, the partial light radiated from the light emitting layer 230 is able to be illuminated directly from the hollow region 270, which reduces the chance of total internal reflection (TIR) of light produced inside the LED chip 200 with double close-loop electrode design, so that the LED chip 200 with double close-loop electrode design of the embodiment has a higher light luminous efficiency.

In the embodiment, to further advance the light luminous efficiency of the LED chip 200 with double close-loop electrode design, a plurality of micro-structures 280 can be made on the exposed surfaces of the first-type doped semiconductor layer 220 and the second-type doped semiconductor layer 240 and the micro-structures 280 are formed through, for example, roughening the first-type doped semiconductor layer 220 and the second-type doped semiconductor layer 240. The micro-structures 280 are fine structures with profiles of, for example, circle, rhombus, pyramid, saw-like shape, wave-like shape and the like and have a periodic regular arrangement or a stochastic irregular arrangement. The micro-structures 280 can further reduce the chance of total internal reflection (TIR) of light produced inside the LED chip 200 with double close-loop electrode design, so that the LED chip 200 with double close-loop electrode design of the embodiment has a higher light luminous efficiency.

In the following paragraphs, the components to build the LED chip 200 with double close-loop electrode design and the relative positions thereof are described in more detail.

Referring to FIG. 2B again, in the embodiment, the material of the substrate 210 includes aluminum oxide (sapphire), silicon carbide (6H-SiC or 4H-SiC), silicon (Si), zinc oxide (ZnO), gallium arsenide (GaAs), spinel (MgAl2O4) or other monocrystalline oxide having a lattice constant close to nitride semiconductor. The composition form of the material of the substrate 210 is, for example, C-plane, E-plane or A-plane.

In the embodiment, the first-type doped semiconductor layer 220 includes a buffer layer 222, a first-type contact layer 224 and a first-type cladding layer 226. The buffer layer 222 is disposed on the substrate 210 and composed of, for example, aluminum gallium indium nitride (AlaGabIn1-a-bN, $0 \leq a$, $b<1$, $a+b \leq 1$). The first-type contact layer 224 is disposed on the buffer layer 222, while the first-type cladding layer 226 is disposed on the first-type contact layer 224 and exposes a part of the first-type contact layer 224 to dispose the first electrode 250 on the first-type contact layer 224.

Accordingly, the second-type doped semiconductor layer 240 includes a second-type cladding layer 242 and a second-type contact layer 244. The second-type cladding layer 242 is disposed on the light emitting layer 230, the second-type contact layer 244 is disposed on the second-type cladding layer 242, and the second electrode 260 is disposed on the second-type contact layer 244. In the embodiment, the first-type doped semiconductor layer 220 is, for example, an N-type doped semiconductor layer, while the second-type doped semiconductor layer 240 is a P-type doped semiconductor layer. Accordingly, the first-type contact layer 224 and the first-type cladding layer 226 are an N-type contact layer and an N-type cladding layer, respectively, while the second-type contact layer 244 and the second-type cladding layer 242 are a P-type contact layer and a P-type cladding layer, respectively. The above-mentioned contact layers and cladding layers are made of aluminum gallium nitride (AlGaN) material family and are doped with different kind and different concentration of dopants to adjust the material property. In addition, the light emitting layer 230 has a multiple-quantum-well structure formed by, for example, indium gallium nitride (InaGa1-aN, $0 \leq a<1$), and the indium and gallium elements in different proportion enable the light emitting layer 230 to radiate lights with different wavelengths.

Remarkably, the doping types of the first-type doped semiconductor layer 220 and the second-type doped semiconductor layer 240 can be interchanged, namely, the first-type doped semiconductor layer 220 can be a P-type doped semiconductor layer and the second-type doped semiconductor layer 240 can be an N-type doped semiconductor layer.

To further advance the electric characteristics of the LED chip 200 with double close-loop electrode design, a plurality of branches can be disposed and extended from the first electrode 250 or the second electrode 260 according to the present invention. Other embodiments accompanying the related figures are described to explain the scheme hereinafter.

The Second Embodiment

Figure 3:
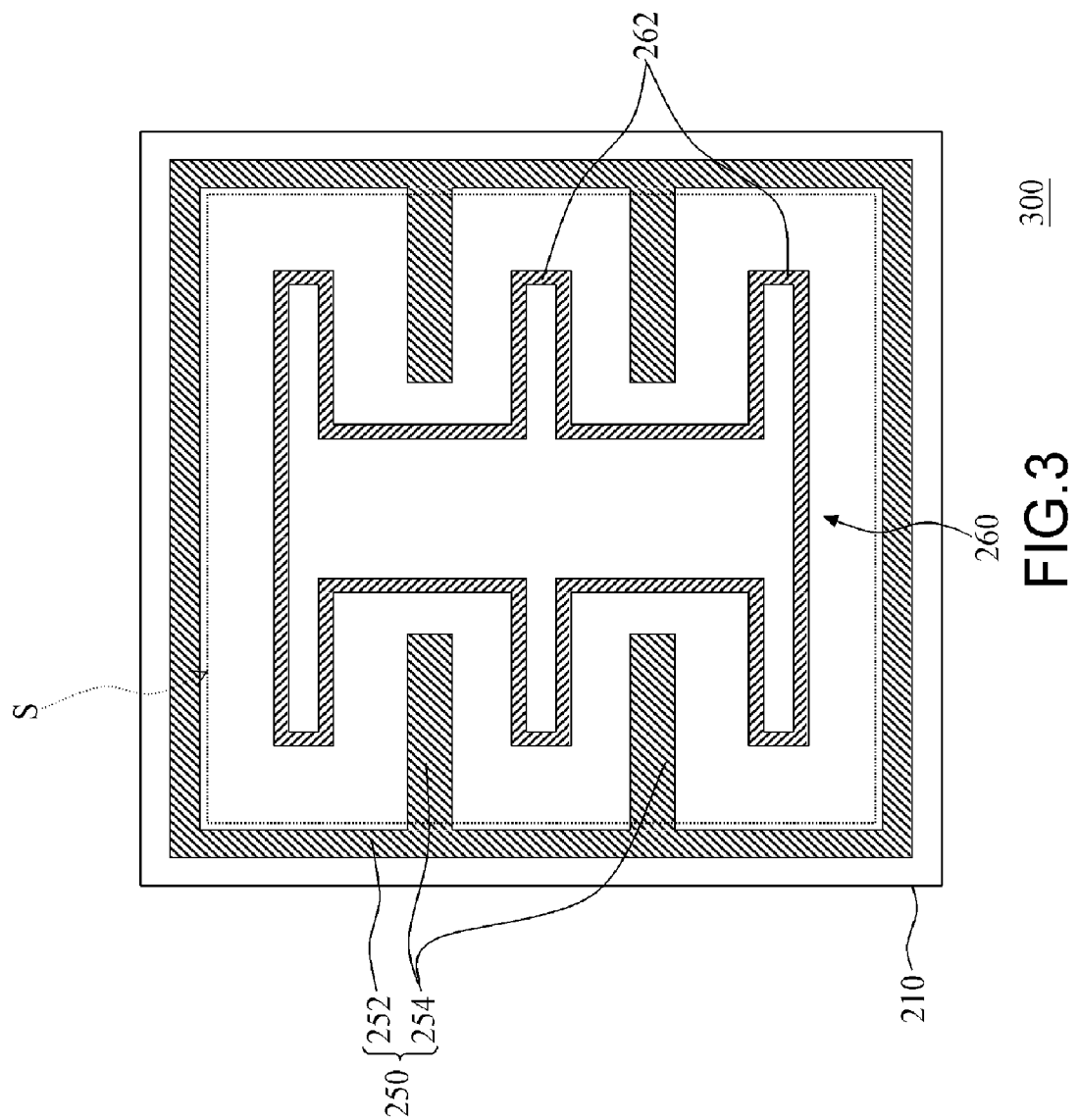
FIG. 3 is a schematic top view of an LED chip with double closed-loop electrode design according to the second embodiment of the present invention.

FIG. 3 is a schematic top view of an LED chip with double closed-loop electrode design according to the second embodiment of the present invention. Referring to FIG. 3, the LED chip 300 with double close-loop electrode design of the present embodiment is similar to the LED chip 200 with double close-loop electrode design in the first embodiment (shown in FIG. 2A) except for the following unique points described in detail. In the embodiment, a first electrode 250 includes a close-loop pattern 252 and a plurality of first branches 254. The close-loop pattern 252 is an encircled close region S on the first-type doped semiconductor layer 220, while the first branches 254 are connected to the close-loop pattern 252 and located inside the close region S. Besides, a second electrode 260 can include a plurality of second branches 262. The first branches 254 and the second branches 262 are alternately arranged. In this way, the distance between the first electrode 250 and the second electrode 260 can be shortened by means of the extended first branches 254 and the extended second branches 262, which result in better electric characteristics of the LED chip 300 with double close-loop electrode design.

In the embodiment, the first branches 254 and the second branches 262 are, for example, but not limited to, bar-like branches. The present invention does not limit the quantity and the arrangement way of the branches. For example, the first branches 254 and the second branches 262 can be curve-like branches and can be extended and arranged in association with the profiles of the first electrode 250 and the second electrode 260 as well. Furthermore, the present invention allows disposing a plurality of sub-branches extended from the first branches 254 and the second branches 262 to further improve the electric characteristics of the LED chip 300 with double close-loop electrode design. For those skilled in the art should be capable of deducing the above-described modifications of the extended branches, and for simplicity, the related diagrams are omitted herein.

The Third Embodiment

Figure 4B:
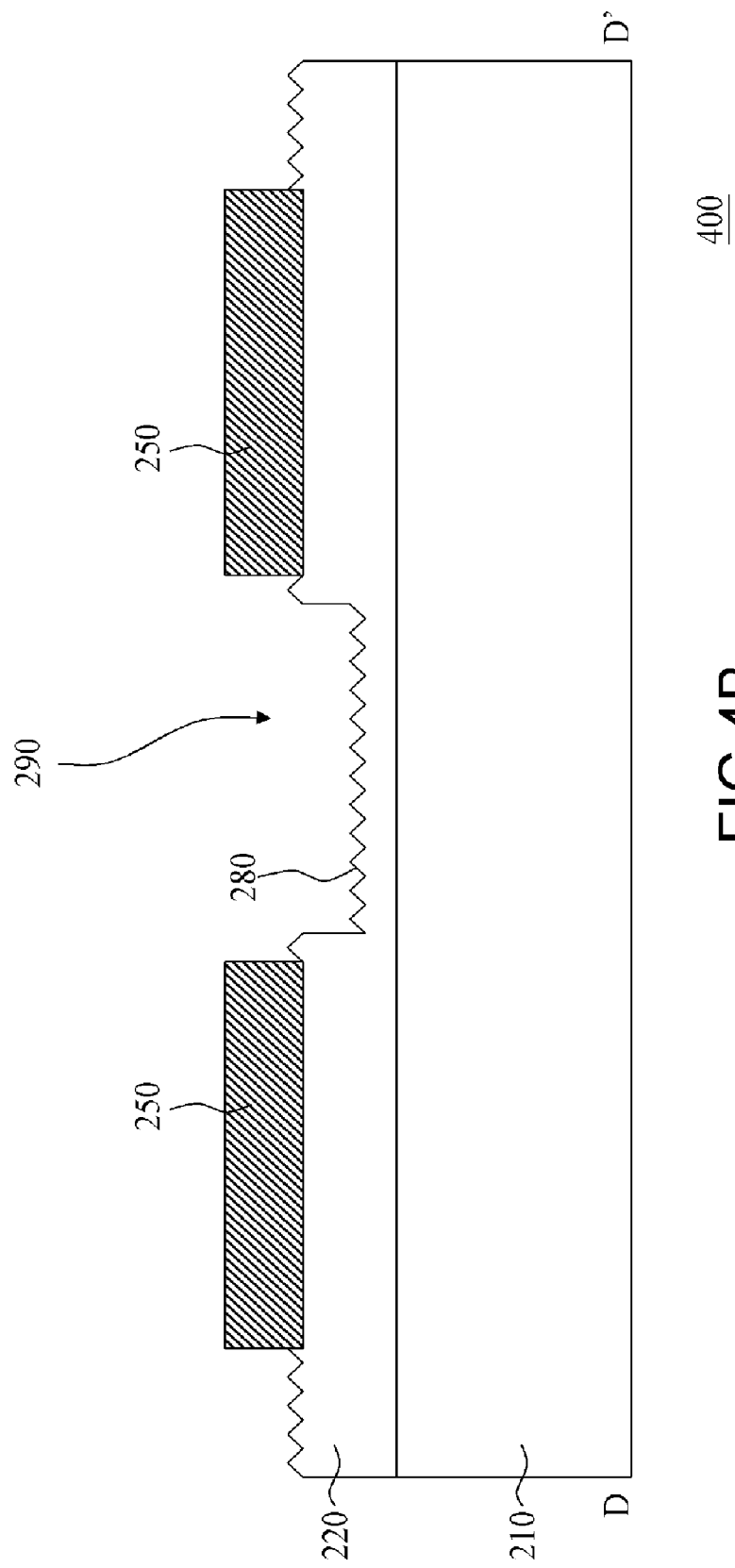
FIG. 4B is a schematic cross-sectional drawing taken along section plane D-D' in FIG. 4A.

FIG. 4A is a schematic top view of an LED chip with double closed-loop electrode design according to the third embodiment of the present invention and FIG. 4B is a schematic cross-sectional drawing taken along section plane D-D' in FIG. 4A. Referring to FIGS. 4A and 4B, the LED chip 400 with double close-loop electrode design of the present embodiment is similar to the LED chip 300 with double close-loop electrode design in the second embodiment (shown in FIG. 3) except that partial regions inside the profiles of the first branches 254 in the LED chip 400 with double close-loop electrode design are a plurality of hollow regions 290. Besides, on the exposed surfaces of the first-type doped semiconductor layer 220 in the LED chip 400 with double close-loop electrode design, a micro-structure 280 is formed.

Additionally, since the hollow regions 290 are the partial regions inside the profiles of the first branches 254, the close-loop pattern 252 and the first branches 254 of the first electrode 250 are still counted as a close-loop pattern. In particular, if one of the first branches 254 is broken, the electrodes at the two ends of the broken area still remain the electric conductivity without affecting the luminous efficiency of the LED chip 400 with double close-loop electrode design.

In summary, the LED chip with double close-loop electrode design of the present invention has at least the following advantages:

1. Since the first electrode and the second electrode have close-loop patterns, therefore if the first electrode or the second electrode is broken, the electrodes at the two ends of the broken area still remain the electric conductivity without affecting the luminous efficiency of the LED chip with double close-loop electrode design.

2. Since the hollow region inside the profile of the second electrode can go through the second-type doped semiconductor layer and the light emitting layer to expose the first-type doped semiconductor layer, therefore the partial light radiated from the light emitting layer can be illuminated directly from the hollow region, thus obtaining a better light luminous efficiency.

3. The micro-structure is able to reduce the chance of total internal reflection (TIR) of light produced inside the LED chip with double close-loop electrode design, so that the LED chip with double close-loop electrode design of the embodiment has a higher light luminous efficiency.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A light emitting diode (LED) chip with double close-loop electrode design, comprising:
   a substrate;
   a first-type doped semiconductor layer, disposed on the substrate;
   a light emitting layer, disposed on the first-type doped semiconductor layer and exposing a part of the first-type doped semiconductor layer;
   a second-type doped semiconductor layer, disposed on the light emitting layer;
   a first electrode, disposed on the first-type doped semiconductor layer and having a close-loop pattern;
   a second electrode, disposed on the second-type doped semiconductor layer, located inside a region encircled by the first electrode and having a close-loop pattern encircling a hollow region which goes through the second-type doped semiconductor layer and the light emitting layer for exposing a part of the first-type doped semiconductor layer; and
   a plurality of micro-structures located on the surface of the first type doped semiconductor layer in the hollow region.

2. The LED chip with double close-loop electrode design as recited in claim 1, wherein the profile of the first electrode is rectangle, circle, ellipse or polygon.

3. The LED chip with double close-loop electrode design as recited in claim 1, wherein the profile of the second electrode is rectangle, circle, ellipse or polygon.

4. The LED chip with double close-loop electrode design as recited in claim 1, wherein the first electrode comprises:
   the close-loop pattern, encircling a close region on the first-type doped semiconductor layer; and
   a plurality of first branches, connecting to the close-loop pattern and located inside the close region.

5. The LED chip with double close-loop electrode design as recited in claim 4, wherein the region inside the profile of each first branch is a hollow region.

6. The LED chip with double close-loop electrode design as recited in claim 4, wherein the second electrode has a plurality of second branches, and the first branches and the second branches are alternately arranged.

7. The LED chip with double close-loop electrode design as recited in claim 1, wherein the arrangement way of the micro-structures is a periodic regular arrangement or a stochastic irregular arrangement.

8. The LED chip with double close-loop electrode design as recited in claim 1, wherein the first-type doped semiconductor layer comprises:
   a buffer layer, disposed on the substrate;
   a first-type contact layer, disposed on the buffer layer; and
   a first-type cladding layer, disposed on the first-type contact layer and exposing a part of the first-type contact layer so as to dispose the first electrode on the first-type contact layer.

9. The LED chip with double close-loop electrode design as recited in claim 1, wherein the second-type doped semiconductor layer comprises:
   a second-type cladding layer, disposed on the light emitting layer; and
   a second-type contact layer disposed on the second-type cladding layer, wherein the second electrode is disposed on the second-type contact layer.

10. The LED chip with double close-loop electrode design as recited in claim 1, wherein the first-type doped semiconductor layer is an N-type doped semiconductor layer, while the second-type doped semiconductor layer is a P-type doped semiconductor layer.

11. The LED chip with double close-loop electrode design as recited in claim 1, wherein the micro-structures are further located on the surface of the second type doped semiconductor layer outside the hollow region.

12. The LED chip with double close-loop electrode design as recited in claim 1, wherein the micro-structures are further located on the surface of the first type doped semiconductor layer outside the hollow region.

* * * * *